United States Patent
Watanabe

[11] Patent Number: 5,952,722
[45] Date of Patent: Sep. 14, 1999

[54] SEMICONDUCTOR DEVICE HAVING HIGH RESISTIVE ELEMENT INCLUDING HIGH MELTING POINT METAL

[75] Inventor: Masaki Watanabe, Tokyo, Japan

[73] Assignee: NEC Corporation, Tokyo, Japan

[21] Appl. No.: 08/825,527

[22] Filed: Mar. 28, 1997

[30] Foreign Application Priority Data

Apr. 19, 1996 [JP] Japan ................................. 8-098341

[51] Int. Cl.$^6$ ........................... H01L 23/48; H01L 23/52; H01L 29/40
[52] U.S. Cl. ........................... 257/754; 257/756; 257/536
[58] Field of Search ..................... 257/756, 757, 257/754, 536

[56] References Cited

U.S. PATENT DOCUMENTS 5,323,049   6/1994   Motonami ................................. 257/755

*Primary Examiner*—Mahshid Saadat
*Assistant Examiner*—S. V. Clark
*Attorney, Agent, or Firm*—Foley & Lardner

[57] ABSTRACT

The semiconductor device has a substrate 101 having a first portion and a second portion, a field insulating film 102 formed on first portion of the substrate, a gate insulating film 103 formed on second portion of the substrate, a first conductive layer 104 selectively formed on the field insulating film and the gate insulating film, a first insulating 108 layer formed on the field insulating film, the gate insulating film, and first conductive layer, a hole 109 formed in first insulating layer exposing a surface of first conductive layer, a second conductive layer 110 selectively formed on a whole surface of the hole and first insulating film, and a high melting point metal selectively formed on second conductive layer.

3 Claims, 14 Drawing Sheets

RESIDUAL OF POLYSILICON

START (a) FORM FIELD OXIDE FILM 102 FOR SEPARATING ELEMENTS ON N-TYPE SILICON SUBSTRATE 101 (ABOUT 7000Å)

(b) IMPLANT IMPURITIES TO FORM OXIDE FILM 103 (ABOUT 300Å) FORM GATE POLYSILICON FILM 104. PATTERN WIRINGS OPTIONALLY.

(c) FORM TRANSISTOR REGION (SD ANNEAL, AT 950°C). FORM OXIDE FILM 108 (ABOUT 4000Å, NORMAL PRESSURE). APPLY SOG TO FLATTEN SURFACE. FORM THROUGH-HOLE 109 ($\phi \risingdotseq 1.2 \mu m$).

(d) FORM POLYSILICON FILM (2 POLY) 110. (ABOUT $1.2 \mu m$, BY CVD REDUCE PRESSURE METHOD)

(e) APPLY ETCH BACK TO 2 POLY TO REMOVE FLAT AREA OF 2 POLY. BURY HIGH RESISTIVE POLYSILICON FILM 601 INSIDE THROUGH-HOLE 109.

(f) FORM POLYCILICON FILM 602 (ABOUT 2500Å). IMPLANT AS ON WHOLE SURFACE (80KeV, $1 \times 10^{16}$ atoms/cm$^2$). TO LOWER RESISTANCE.

(g) PATTERN POLYSILICON FILM 602 WITH RESISTANCE LOWERED INTO DESIRED SHAPE. FORM P GLASS 113, CONTACT 114, Al WIRING 115.

END

SEMICONDUCTOR DEVICE HAVING HIGH RESISTIVE ELEMENT INCLUDING HIGH MELTING POINT METAL

BACKGROUND OF THE INVENTION

1. Field of the Invention

The present invention relates to a semiconductor device, and particularly to a semiconductor device having a high resistive element including a high melting point metal.

2. Description of the Related Art

Figure 4:
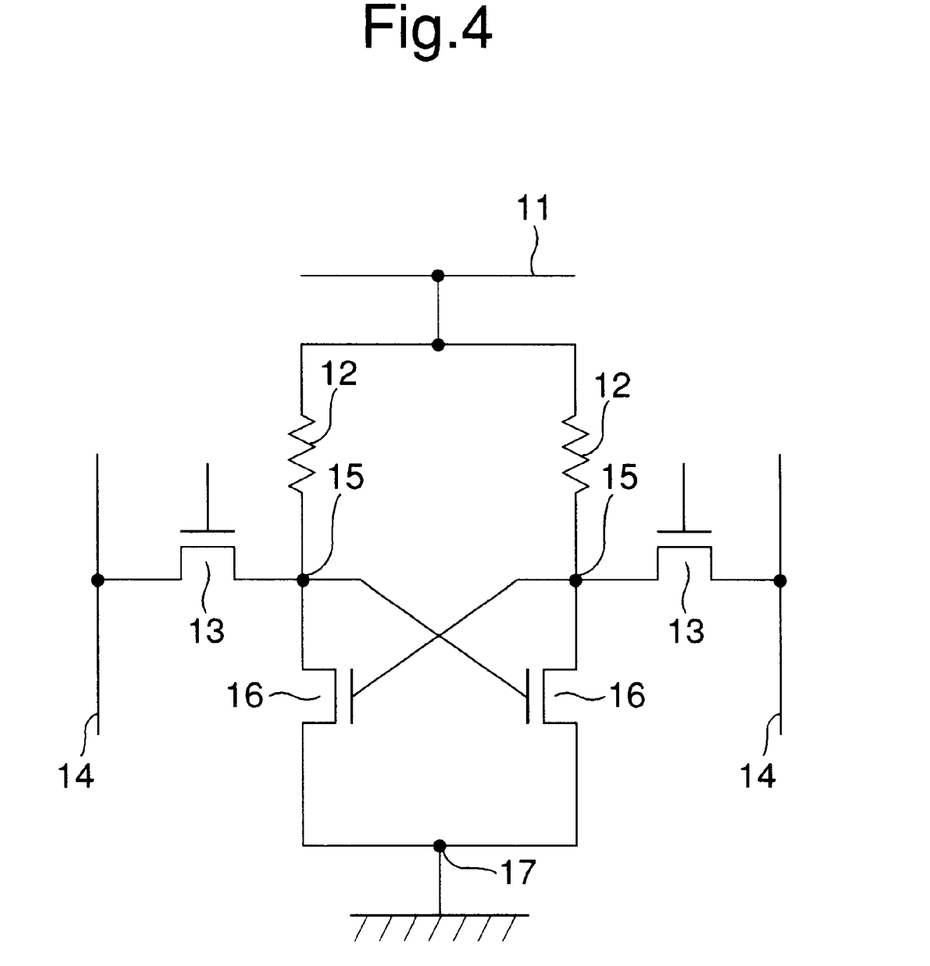
FIG. 4 is a circuit configuration of a high resistance load type four transistor SRAM memory.

Recently, a high resistive elemtent has been used as a load of a SRAM memory cell. Such as SRAM memory cell is shown in FIG. 4. FIG. 4 illustrates a circuit construction of a SRAM memory cell composed of the foregoing high resistance load type four transistors. A power supply line 11 for Vcc is connected to direct contacts 15 through high resistance loads 12. The distinctive aspect of this construction lies in that the gate of one driver transistor 16 is directly connected to the drain of the other diver transistor 16 at the direct contact 15. The data come in and out through bit lines 14 and word transistors 13.

Figure 12:
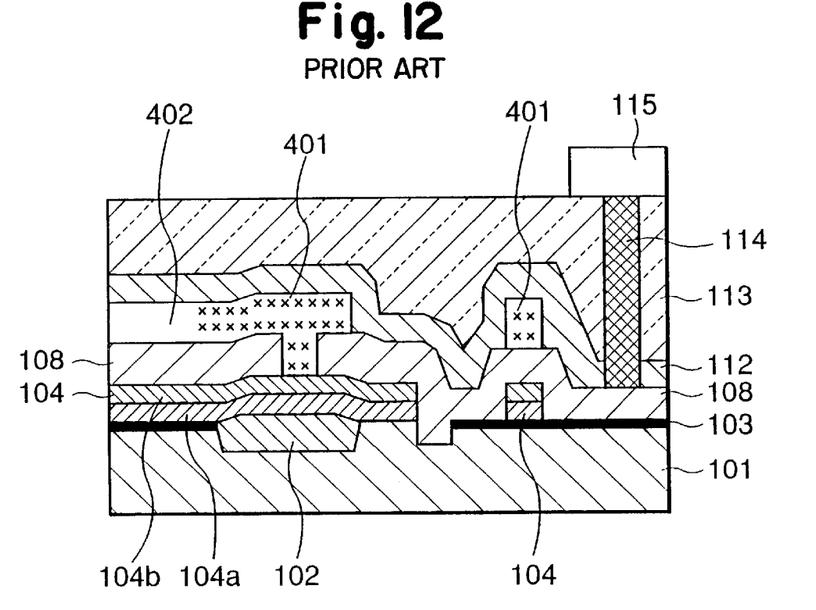
FIG. 12 is a sectional view showing a typical construction of the conventional semiconductor device.

FIG. 12 is a sectional view illustrating a construction of a cell in a conventional typical SRAM. Each of the cells in the SRAM is constructed on a silicon substrate 101, which comprises a field oxide film 102 for separating devices, a first conductive layer 104 consisting of source region, drain region, and gate region of the transistor and the like, insulating layers of a silicon oxide film 108 and 112 and a phosphorus glass 113 for insulating the conductive layers, a second conductive layer 401 and 402 of a polysilicon (hereafter, mentioned as poly Si) wiring formed on and through the first insulating layer 108, and a contact 114 connected to an aluminum wiring 115 and the like. Generally, the second conductive layers are formed of the poly Si wiring on a second layer (hereafter, abbreviated as 2 poly), and the high resistance region 402 is used for high resistance devices and a part of the low resistance region 401 is used for the power supply line.

A most widely used method to form the second conductive layers is the division fitting exposure technique whereby the low resistance region and the high resistance region are separately made in non-self matching. Application of this method has required the exposure technique to fit four scale divisions among the direct contact process for directly bringing the gate electrode and diffusion layer into contact, the poly poly contact process for connecting a 2 poly to a poly Si of the gate electrode, the 2 poly forming process, and the 2 poly resistance control process. However, this method takes many processes and the 2 poly formation requires an advanced micro wiring forming technique, and it is difficult to reduce the resistance in the low resistance region of the 2 poly and the 2 poly resistance varies in the subsequent process using the chemical vapor deposition (CVD) method and the like.

Figure 15A:
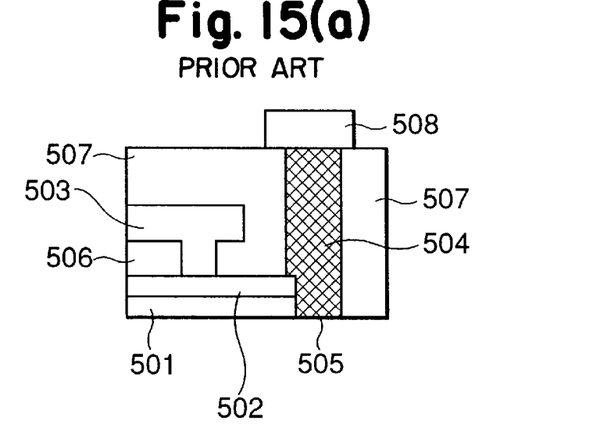
FIGS. 15(a)–15(c) show the other examples of sectional construction.
Figure 15B:
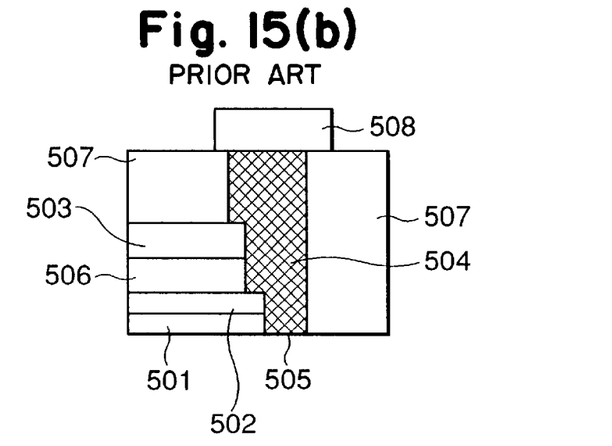

In order to decrease the production processes, there have been proposals that reduce the direct contact process or the poly poly contact process by making up the cell construction as shown in FIG. 15(a) or FIG. 15(b). And, in order to improve working accuracy of the 2 poly, increasing the poly Si wiring layer and making a three-dimensional construction can be considered; however, it increases processes to a large extent as well as increases uneven surfaces only to make the subsequent aluminum wiring difficult. In order to overcome these imperfections, there have been disclosed a method whereby a bedding gate unevenness is flattened by means of the chemical mechanical polishing (CMP) before forming the 2 poly wiring so as to improve the working accuracy, a method whereby a high resistance poly Si is formed on the inner wall of a through-hole and the aluminum wiring is electrically connected to the high resistance poly Si in forming the metal contact and load resistors are formed in the contact area, and a method whereby a Si oxide film and Si nitride film are laminated on the bottom of a contact through-hole to use for the high resistance load.

As a measure to prevent the resistance variation of the high resistance loads, a method to form a thermal oxidation film of about 50 Angstrom has been used in practice. This method is used for reducing the charge trapping in the 2 poly CVD oxide film interface and for the barrier against the phosphorous diffusion from the phosphorous glass layer and the like.

Although each of the foregoing methods is effective as a measure to individual problems, it is not effective as a measure to the other problems; or still more advanced technique is required to solve the problem, leaving problems for practical use.

The Japanese Patent Laid-open No. Hei 1-124250 discloses, to solve these problems, a construction in which the inside of the through-hole is filled up with the high resistance poly Si. FIG. 13(a) through FIG. 13(g) and FIG. 14 show the outline of the production method of the construction.

Figure 13A:
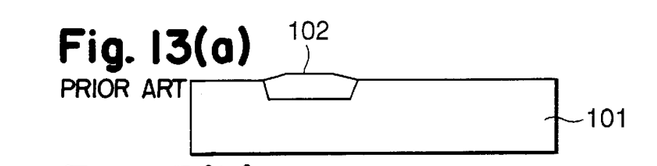
FIGS. 13(a)–13(g) show a sectional construction in the sequence of the conventional production process.

(a) first, a field oxide film 102 of about 7000 angstrom is formed as an element separating film on an N-type Si substrate 101 by means of a well-known method.

Figure 13B:
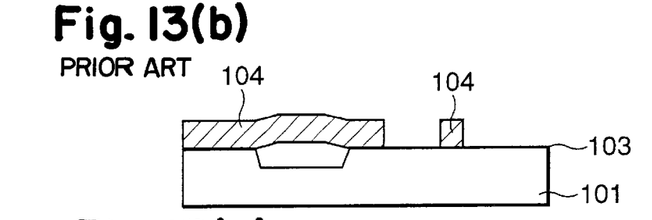

(b) next, a gate oxide film 103 of about 300 angstrom is formed, and then a gate poly Si film 104 of about 4000 angstrom is formed into optional wirings.

Figure 13C:
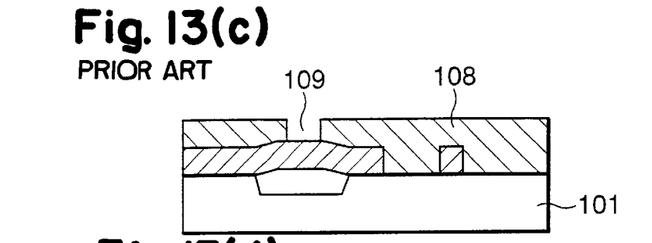

(c) next, a source and drain layer of the N channel only are formed as a transistor by the well-known method. The SD annealing temperature is 950° C. And afterward, an oxide film of about 4000 angstrom is formed under atmospheric pressure, on which SOG is applied to make the surface flat, and then a through-hole 109 for connecting the second layer wiring to the gate electrode is formed with an opening diameter of about 1.2 $\mu$m.

Figure 13D:
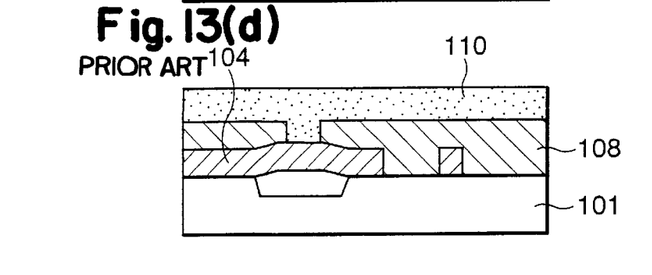

(d) next, a poly Si film 110 of about 1.2 $\mu$m is formed as a 2 poly by the reduced pressure CVD method.

Figure 13E:
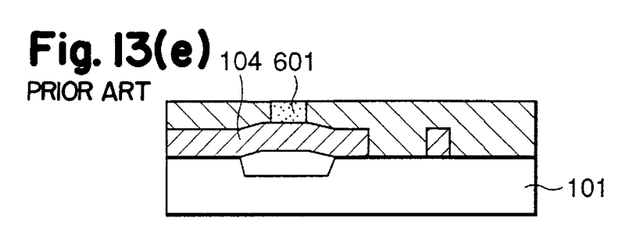

(e) next, the poly Si film 110 is removed entirely from the flat layer by means of the etch back. Here, a high resistance poly Si 601 remains inside the through-hole 109 to fill up to the upper side.

Figure 13F:
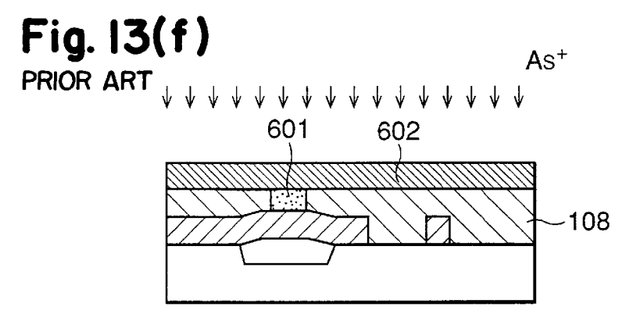

(f) next, a poly Si film 602 of about 2500 angstrom is formed, on the whole surface of which arsenic (As) is implanted under 80 keV, 1 exp 16 atoms/cm$^2$ to lower the resistance of the film.

Figure 13G:
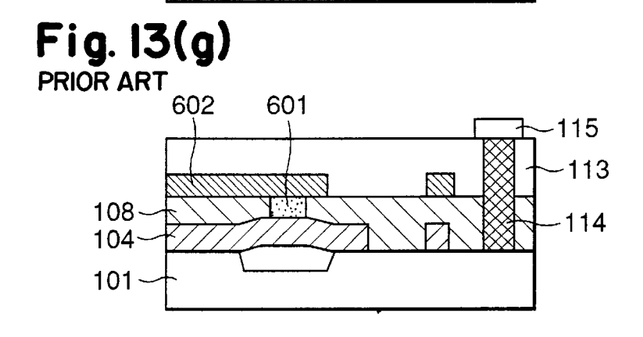
Figure 14:
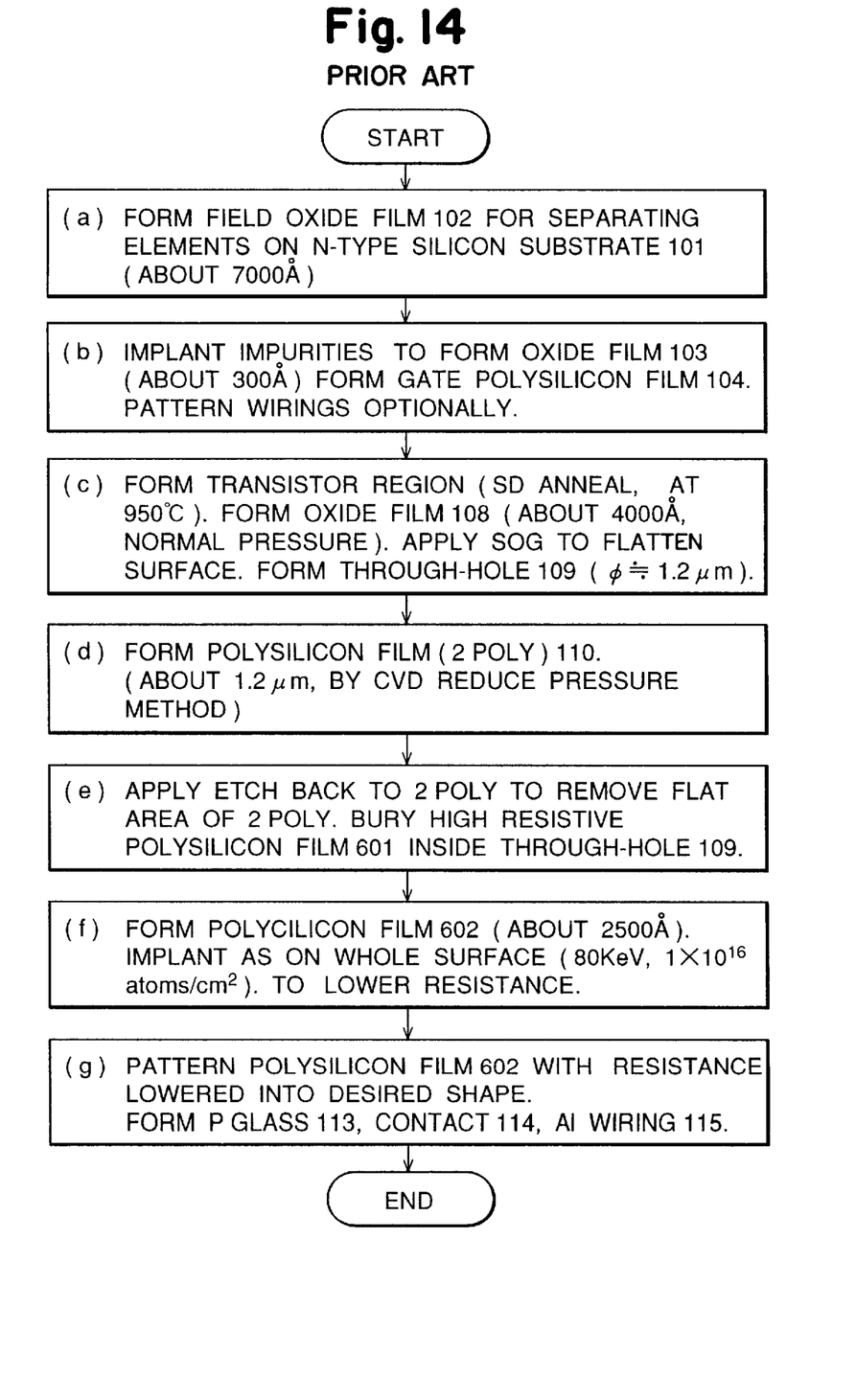
FIG. 14 is a flow chart for explaining the production process in FIG. 13.

(g) afterward, the low resistance wiring 602 is patterned, and a phosphorous glass 113, contact 114, and aluminum wiring 115 are formed.

This proposal can solve all the foregoing problems, the construction is simple, and current facilities can be used for the production, which are advantageous in this method. However, there are still problems as follows, concerning the construction in which the inside of the through-hole is filled up with a high resistance poly Si to form a high resistance load.

Figure 15C:
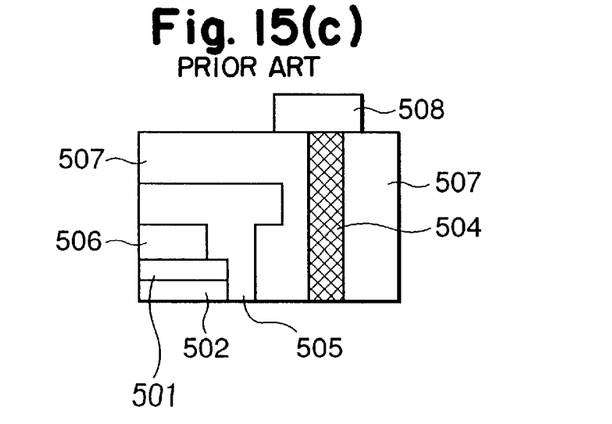

Since the whole inside of the poly poly contact is made high resistive, the direct contact process cannot be eliminated by a constriction shown in FIG. 15(c). Only the division fitting exposure process for controlling the 2 poly resistance can be removed in the conventional method.

The resistance of the high resistance poly Si formed inside of the through-hole greatly depends on an intrinsic resistance of the poly Si, which makes the resistance control difficult and the matching among production lines difficult.

In case the through-hole diameter is large, it is necessary to deposit the 2 poly so thick as to fill up the hole. Therefore, the etch back process after the 2 poly film formation becomes essential, which invites increase of the process as well as problem of the dependency in the wafer of the 2 poly etching rate.

SUMMARY OF THE INVENTION

It is therefore art object of the present invention to provide a semiconductor device, whereby two division fitting exposure processes in the direct contact and the two polysilicon resistance control process can be eliminated at the same time, and the resistance of the high resistance loads can easily be controlled and stable production can be maintained even when the through-hole of a large diameter is used.

In order to accomplish the foregoing object, the semconductor device of the present invention has a substrate having a first portion and a second portion, a field insulating film formed on said first portion of said substrate, a gate insulating film formed on said second portion of said substrate, a first conductive layer selectively formed on said field insulating film and said gate insulating film, a first insulating layer formed on said field insulating film, said gate insulating film, and said first conductive layer, a hole formed in said first insulating layer exposing said a surface of said first conductive layer, a second conductive layer selectively formed on a whole surface of said hole and said first insulating film, and a high melting point metal selectively formed on said second conductive layer.

In the semiconductor device of the invention, as described above, the second conductive layer takes on a structure in which a high melting point metal film and a high resistance poly Si film are laminated; therefore, the second conductive film is not necessary to form thick, and the resistance of the connected area in the first and the second conductive film can easily be controlled.

Since the first conductive layer is a low resistance conductor of which surface is oxidized inside the through-hole, high melting point metal, or metal silicide of the foregoing metal, the resistance variation due to the diffusion of the impurities from the upper layer becomes a negligible degree. Therefore, the production margin for the thermal hysterisis in the subsequent process increases, and thinning the 2 poly film becomes effective. Since, the resistance of this metal is lower than that of the poly Si resistor, it is effective to reduce the resistance or the power supply line.

DETAILED DESCRIPTION OF THE PREFERRED EMBODIMENTS

Preferred embodiments of the invention will now be described with reference to the accompanying drawings.

Figure 1:
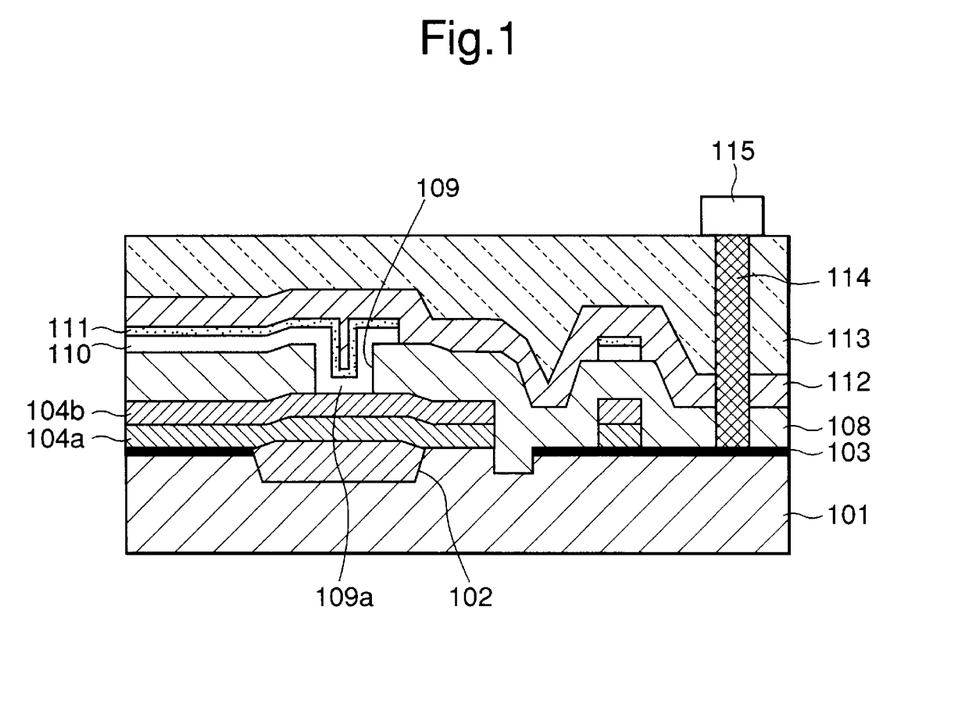
FIG. 1 is a partial sectional view showing a construction of the semiconductor device according to the first embodiment of the present invention.
Figure 5:
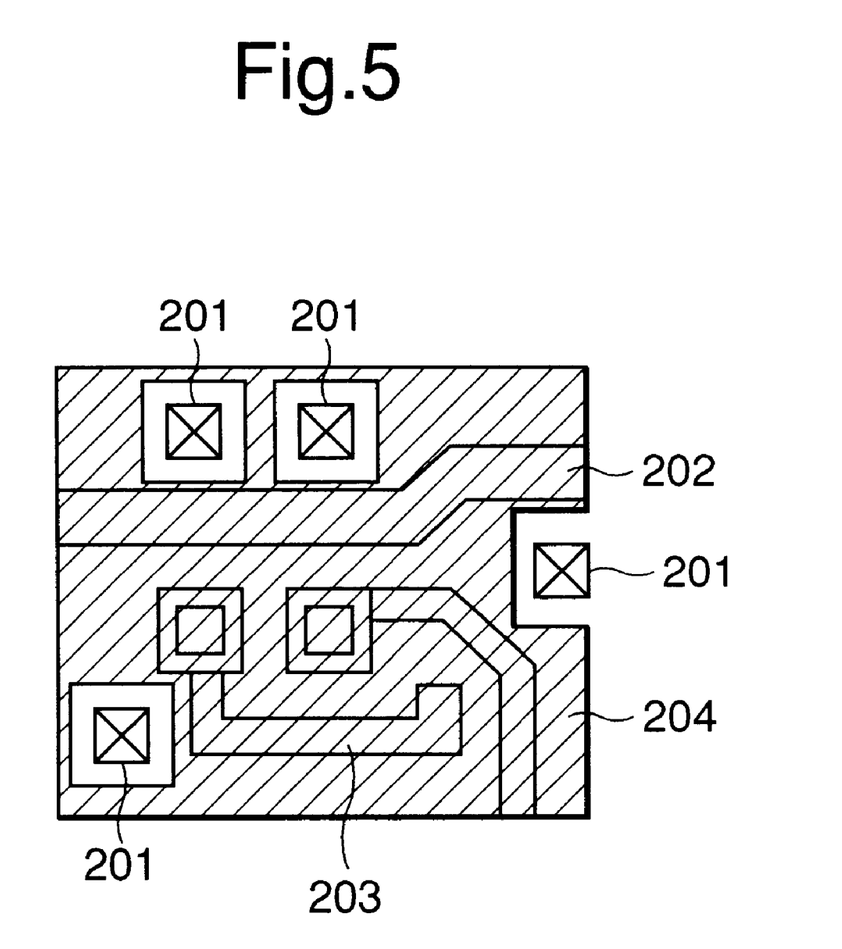
FIG. 5 is a layout on the surface relating to the first embodiment.
Figure 6A:
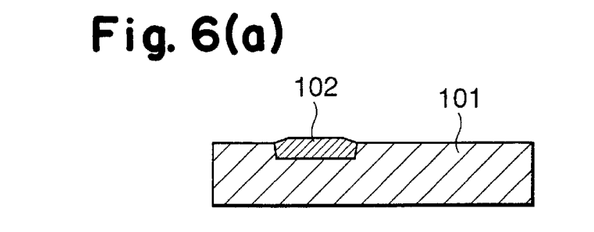
FIGS. 6(a)–6(h) show a partial sectional construction for explaining an example of the production process of the semiconductor device according to the first embodiment of the present invention.
Figure 6B:
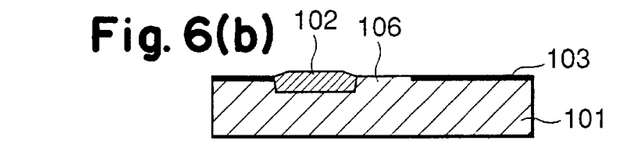
Figures 6C, 6D:
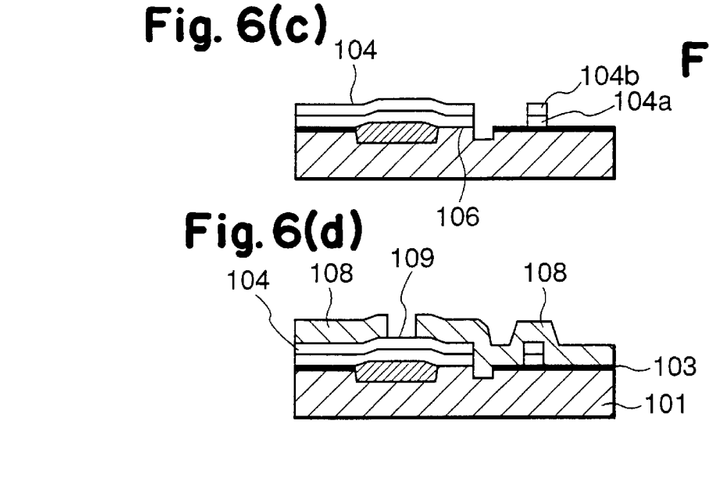
Figure 6E:
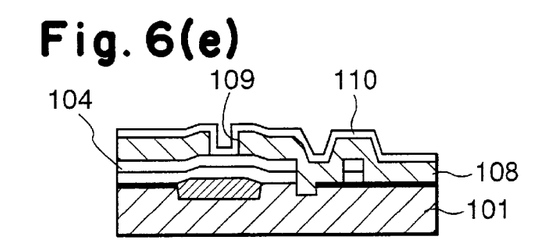
Figures 6F, 6G:
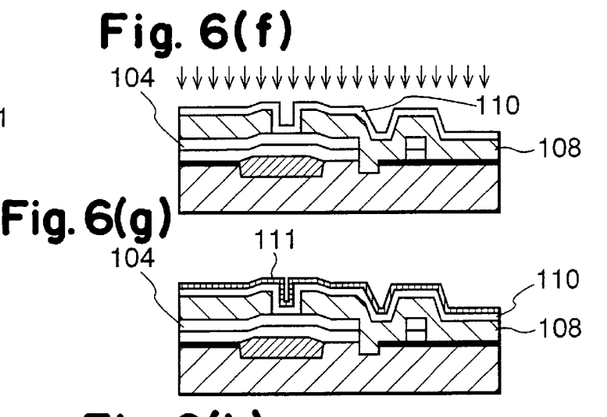
Figure 6H:
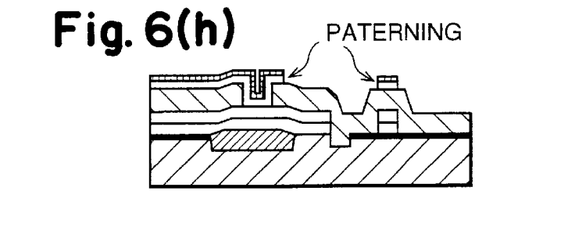
Figure 7:
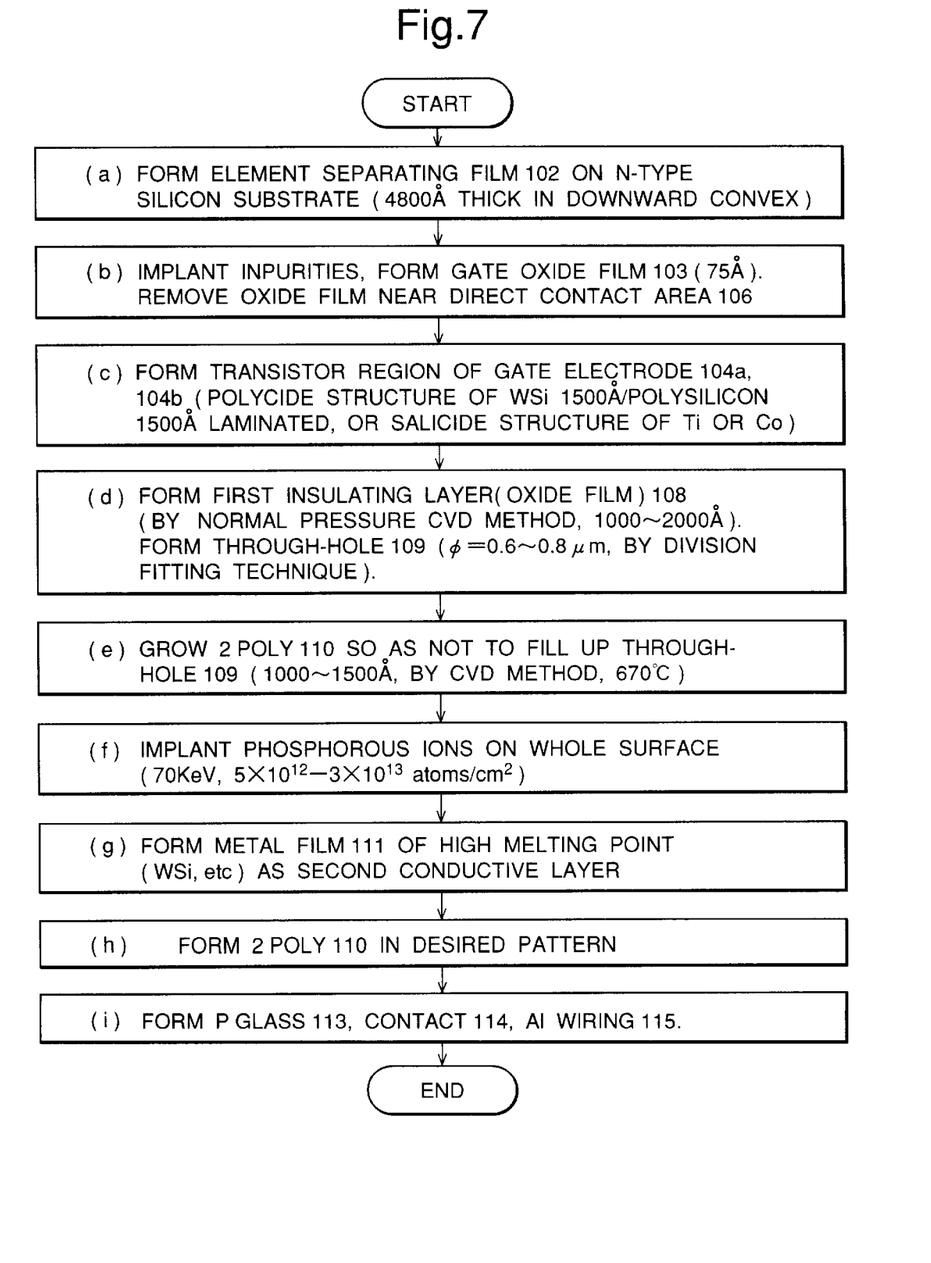
FIG. 7 is a flow chart for explaining the production process in FIG. 6.

FIG. 1 is a partial sectional view of a semiconductor device according to the first embodiment of the invention, FIG. 5 illustrates a surface layout of the semiconductor device shown in FIG. 1, FIGS. 6(a)–(h) are a series of partial sectional views shown in sequence of the production process of the semiconductor device in FIG. 1, and FIG. 7 is a chart for explaining the product flow of the semiconductor device shown in FIGS. 6(a)–(h).

In FIG. 1, the semiconductor device of the first embodiment is constructed on an N-type silicon (Si) substrate 101, which comprises an element separating film 102, gate oxide film 103, a first conductive layer 104 consisting of a poly Si 104a and a polycide gate of a silicified tungsten (WSi) 104b, a first insulating film 108, a second conductive layer consisting of a 2 poly 110 that fills a through-hole 109 on the first insulating film 108 to reach the first conductive layer 104 as well as a poly poly contact 109a and a metal 111 of a high melting point, a second insulating film 112, a phosphorous glass 113, aluminum wiring 115, and contact 114 that reaches the aluminum wiring 115 from the gate oxide film 103.

In the production method of the semiconductor device relating to the first embodiment, in FIG. 6(a)–(h) and FIG. 7

(a) first, the element separating film 102 is formed in a downward convex shape with the thickness of about 4800 angstrom on the N-type silicon substrate 101.

(b) next, after the implantation of channel impurities for controlling the VT voltage, the gate oxide film 103 of about 75 angstrom is formed, and afterward, the gate oxide film is removed from a direct contact area 106 where the gate and diffusion layer are directly bonded.

This process is not specified in the foregoing conventional method, however, it is necessary also for the conventional. If this is omitted, such a direct contact 505 using a metal contact as shown in FIG. 15(a) becomes necessary; accordingly, the layout for an aluminum wiring 508 is confined. In practice, the number of the aluminum wiring has to be increased. Further, to form such a direct contact through the poly poly contact as shown in FIG. 15(c) will form a high resistance between the diffusion layer and the gate electrode, which is not practical.

(c) next, a gate electrode 104 is formed by a well-known method to form a transistor area. In this case, the gate electrode 104 applies a polycide structure in which a WSi 1500 angstrom and a poly Si 1500 angstom are laminated, or a salicide structure using a titanium (Ti) or a cobalt (Co).

(d) next, an oxide film 108 of a first insulating layer is formed with the thickness of about 1000 to 2000 angstrom. To increase the film thickness will produce voids between adjoining gates; and to decrease it will increase the layer capacitance between a 2 poly 110 and the gate electrode 104, each of which becomes a high level not negligible.

Afterward, a through-hole 109 for a poly poly contact 109a is made to connect the 2 poly 110 and the gate electrode 104. The hole diameter in this case is set to 0.6 to 0.8 μm. In the conventional technique, a smaller hole diameter is regarded as better, however, in the present invention, a larger hole diameter is better.

The foregoing processes (a) through (d) is almost same as the conventional technique.

(e) next, the 2 poly 110 of about 1000 to 1500 angstrom is grown under the temperature of about 670° C. by the CVD method. The 2 poly 110 remaining inside the through-hole 109 is used as a high resistance load.

At this process, the 2 poly film is thin and the inside of the through-hole is not entirely filled up. Since the 2 poly film is thin, the conventional 2 poly etch back process becomes needless; therefore, process dispersion due to the etch back disappears, leading to increasing the production margin. Further, since the rough underlying the 2 poly does not exert any influence on this method, the conventional flattening process of the surface underlying the 2 poly becomes totally unnecessary, which significantly reduces the process. Amorphous Si can be used as the material of the 2 poly without any inconvenience. After forming the 2 poly 110, the hydrogen annealing may be applied to make the 2 poly 110 still higher resistive in the same manner as the conventional.

The 2 poly may be made so thick as to fill up the inside of the through-hole. Where the through-hole diameter has to be made small from the condition of the cell size, a thin 2 poly will be sufficient to fill up the through-hole, and the inside of the poly poly contact will inevitably be filled up. The resistance inside the through-hole in this case can be controlled by the layer-to-layer film thinning technique.

(f) next, phosphorous ions are implanted on the whole surface under 50 keV, 5 exp 12 to 3 exp 13 atoms/cm$^2$.

The resistance inside the through-hole is determined in accordance with the resistance of the central part inside the through-hole, and therefore, the implantation of phosphorous ions enables the resistance of the poly poly contact to be freely controlled. Where the intrinsic resistance of poly Si is needed to be used, the phosphorous implantation process is unnecessary. Where the operational speed is intended to increase through lowering the VT voltage for memory transistors and the resistance of the high resistance loads is unnecessarily high, retention deficiency will occur; therefore, the possibility of the resistance control is significant.

Furthermore, since, in the conventional technique, the through-hole is filled up with the 2 poly, the poly Si film becomes thick in the high resistance area; and therefore, where the resistance control is performed by the ion implantation, the acceleration energy is needed to increase. Still, the resistance is determined not at the peak of the impurity profile but at the tail, the dispersion on production becomes large.

(g) Next, a film of the high melting point metal 111 such as WSi is formed with the thickness, of about 300 to 700 angstrom. This process is different from the conventional. technique such that the low resistance layer is formed by means of the impurity ion implantation, and resistance variation due to impurity diffusion from the upper layer WSi becomes a negligible level. Therefore, the production margin to thermal hysteresis in the subsequent process is improved and thinning the 2 poly film can display effectiveness. Furthermore, since the resistance of this metal is lower than that of the poly Si resistor, it is effective to decrease the resistance of the power supply line.

(h) Afterward, the 2 poly 110 is patterned in optional shapes. Here, as shown in FIG. 5, in the layout of the 2 poly 204, the periphery of metal contacts 201 is only needed to be removed, which makes fine patterning needless. Thus, the possibility of short-circuits between wirings greatly reduces, enhancing the production yield.

(i) The following processes do not greatly differ from those of the conventional technique. Namely, the thermal treatment of more than 800° C. applied after the formation of the 2 poly 110 needs the control using the RTA (Rapid Thermal Anneal) method controllable to the second, also in this embodiment, the same as in the conventional. This is to prevent the phosphorous or arsenic atoms doped into the gate poly Si of the N-channel transistor from diffusing into the poly poly contact. Although the RTA method is applied, the poly Si at the bottom of the through-hole contains slight impurities by diffusion to lower the resistance, which differs from the conventional construction such that the bottom part of the contact is a resistor of a high resistance.

Next, another production method of the semiconductor device relating to the first embodiment will be described referring to FIGS. 8(a)–(c) and FIG. 9.

Figures 8A, 8B, 8C:
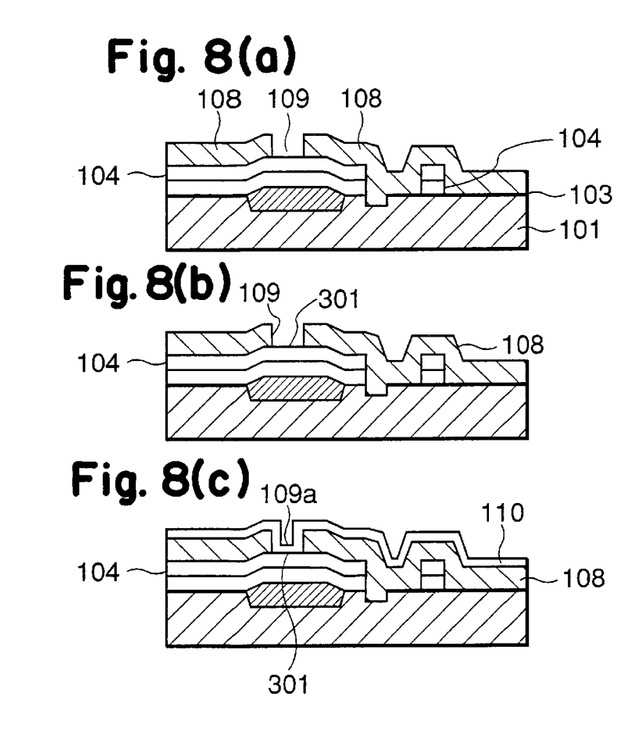
FIGS. 8(a)–8(c) show a partial sectional construction for explaining another example of the production process of the semiconductor device according to the first embodiment of the present invention.
Figure 9:
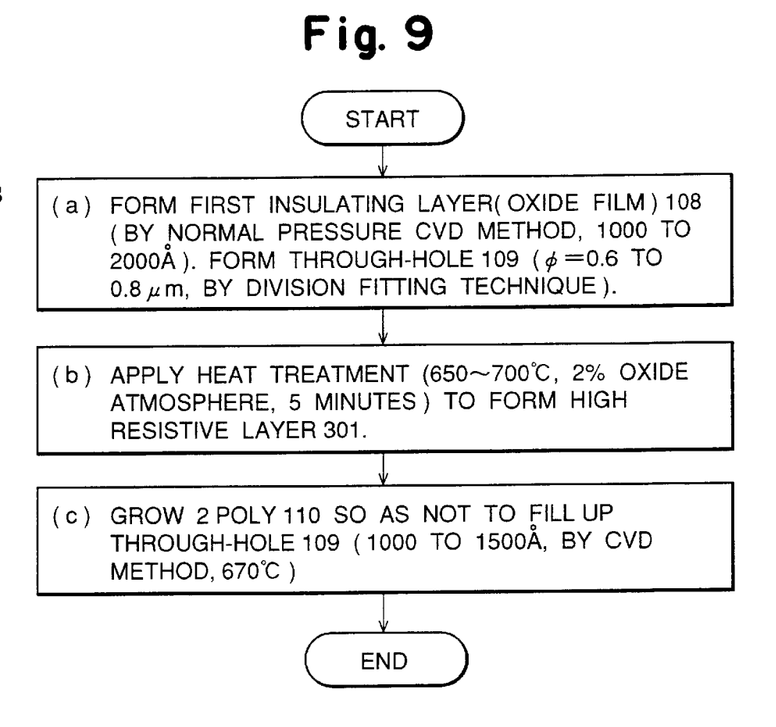
FIG. 9 is a flow chart for explaining the production process in FIGS. 8(a)–8(c)

This method comprises the process (a) until an opening for the through-hole is formed in the same manner as the processes (a) through (d) in the first embodiment; the thermal treatment process (b) to apply 650 to 700° C., 2% oxygen ambient atmosphere, for five minutes after the process (a); and thereafter, the process (c) same as the process (e) and the subsequent processes in the first embodiment. With this process arrangement, as shown in FIG. 8(b), an exposed part 301 of the gate electrode WSix on the bottom of a through-hole will be oxidized so that the high resistance layer can stably be formed. This high resistance layer 301 functions as a barrier against the phosphorous diffusion from the first poly Si layer.

In the foregoing description, although WSix is used as the high melting point metal 111 overlying the 2 poly 110, titanium or cobalt may be used.

Owing to the low resistance wiring 111 of WSi or the like provided on the whole surface on the 2 poly 110, the variation of the 2 poly resistance due to the subsequent processes decreases to a negligible degree. Therefore, a surface protection film to protect the 2 poly surface by a thermal oxidation film or the like becomes unnecessary, which has been regarded as necessary in some part of the field.

As the material to be implanted and diffused for controlling the 2 poly resistance, As (arsenic), Sb (antimony), or the like is effective in addition to the foregoing P (phosphorous). And, after forming the 2 poly film, hydrogen (H2) annealing will make the load resistance still higher.

When the opening diameter of the through-hole becomes smaller than half of submicron, the 2 poly will fill up the through-hole. Here, the low resistance layer may be formed in such a manner that the 2 poly is left as it is without applying the etch back and As is implanted on the surface. In this case, the 2 poly film becomes thicker than half of the through-hole diameter, and the overhead of a connecting hole is not necessarily flat, which, however, is not needed to be made flat.

Still more, to introduce oxygen ($O_2$) on the way of growing the 2 poly and to form a thin layer by oxygen leakage will make the grain size controllable. Generally, the adoption of an $O_2$ leakage layer is likely to increase the resistance of the poly poly contact, and it is an effective method for producing a standard SRAM.

Next, the second embodiment of the invention will be described with reference to FIG. 2 and FIGS. 10(a)–(f).

Figure 2:
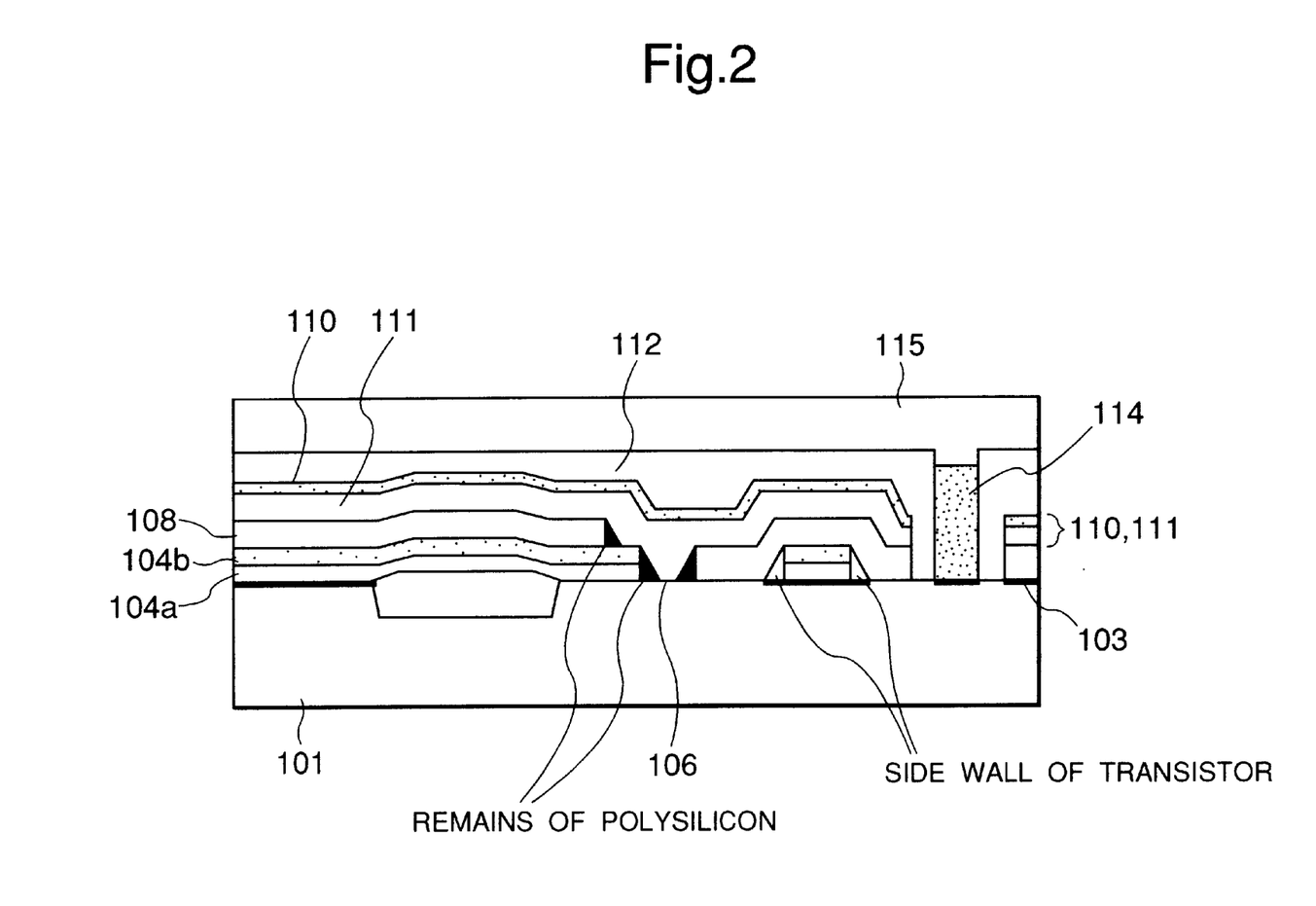
FIG. 2 a partial sectional view showing a construction of the semiconductor device according to the second embodiment of the present invention.

The semiconductor device of the second embodiment has, as shown in FIG. 2, a first conductive layer of a polycide gate 104a, 104b having a through-hole, on the side wall of which a low resistance film remains; a second conductive layer of a metal film WSi 111 of low resistance and high melting point; and a high resistance poly Si film between the first and the second conductive layer.

Figure 10A:
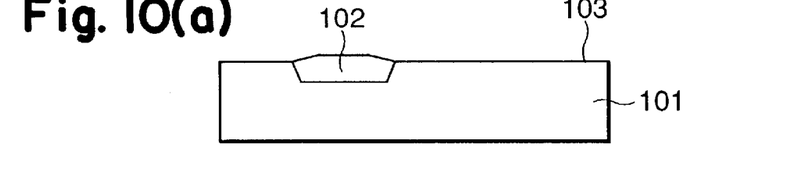
FIGS. 10(a)–10(f) show a partial construction for explaining an example of the production process of the semiconductor device according to the second embodiment of the present invention.

The production method of the semiconductor device of this second embodiment is as shown in FIGS. 10(a)–(f):

(a) First, an element separating film 102 of about 4800 angstrom is formed on the N-type Si substrate 101 in the same manner as in FIG. 6(a) of the first embodiment, channel impurities for the VT control are implanted, and thereafter, a gate oxide film 103 of about 75 angstrom is formed.

At this stage in the first embodiment, the selective etching process for the gate oxide film was necessary to form the direct contact area. Without this selective etching process, the diffusion layer and the gate electrode have to be connected through the aluminum wiring Al, and the layout of the aluminum wiring is limited. When the aluminum wiring of more than three layers are not available, the connection through the aluminum wiring becomes extremely difficult. However, in this embodiment, the selective etching process for the direct contact is not needed.

Figure 10B:
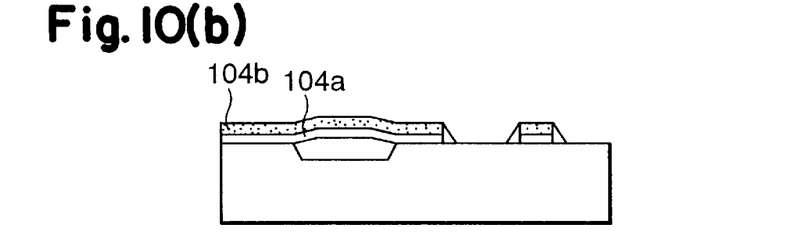

(b) Next, the gate electrodes 104a, 104b are patterned to form the transistor areas. The gate electrodes 104a, 104b employ a polycide structure in which silicified tungsten (WSi): 1500 angstrom/poly Si: 1500 angstrom are laminated, or a salicide structure using titanium Ti or cobalt Co.

Figure 10C:
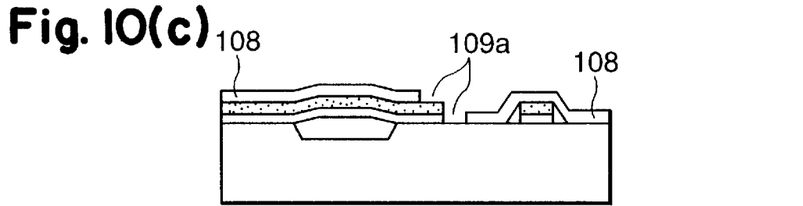

(c) Next, a first oxide film 108 is formed with the thickness of about 2000 angstrom by means of the atmospheric pressure CVD method suitable for forming under comparably low temperature. And then, by the division fitting technique, an opening of a poly poly contact 109a is formed for connecting the 2 poly and the gate electrodes. The opening diameter is made larger than the gate electrodes. Generally, the diameter should be set to about 1.0 μm in the longitudinal direction. When the poly poly contact is formed, oxide films should not virtually be left on the walls of the gate electrodes.

Figure 10D:
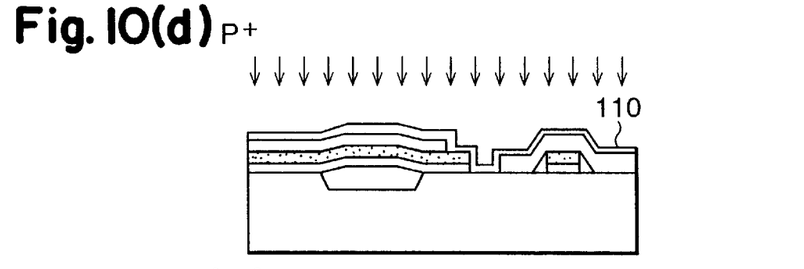

(d) Afterward, a first 2 poly 110 is grown to about 500 angstrom under the temperature of about 670° C. by means of the CVD method. And then, phosphorous ions are implanted on the entire surface of the first 2 poly under 50 keV, about 1 exp 13 atoms/$cm^2$ by the rotary implantation method with a slant angle of 30°. The gate electrodes and diffusion layer are connected through the 2 poly 110 by this operation.

Figure 10E:
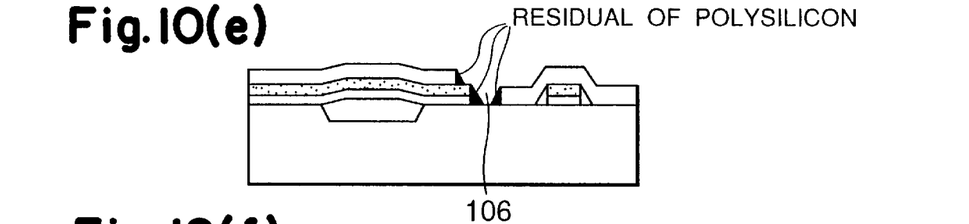

(e) Next, the poly Si on the whole surface is removed by the anisotropic etching (whole surface etchings). Since the gate electrodes are vertical, the poly Si remains on the side walls of the gate electrodes as not totally etched back. The remaining part is served as a direct contact 106 for directly connecting the gate electrodes and the diffusion layer. Further, to optimize the energy for implanting the phosphorous ions can effectively destroy the naturally made oxide film sitting on the 2 poly 110 and the silicon substrate interface.

Figure 10F:
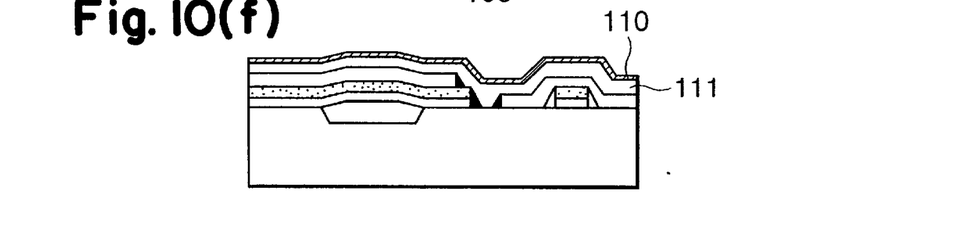

(f) Next, a second poly Si film is grown to 1000 to 2000 angstrom, or which a film of about 400 angstrom is formed of a high melting point metal such as WSi. Thereby, the wiring of the second layer becomes the polycide structure. The poly Si film underlying the second grown WSi functions as high resistance loads.

The subsequent processes thereafter are the same as those after (h) in FIGS. 6(a)–(h) of the first embodiment. Removing only the polycide near the metal contact will complete the memory cell in FIG. 2.

Where the thermal treatment over 800° C. after forming the 2 poly is applied in order to prevent the gate poly Si for the N-channel transistors and the phosphorous or arsenic atoms doped into the diffusion layer from diffusing into the poly poly contact, the thermal treatment in this embodiment also needs the control using the RTA method controllable to the second.

Next, the semiconductor device of the third embodiment will be described with reference to FIGS. 3 and 11(a)–(f).

Figure 3:
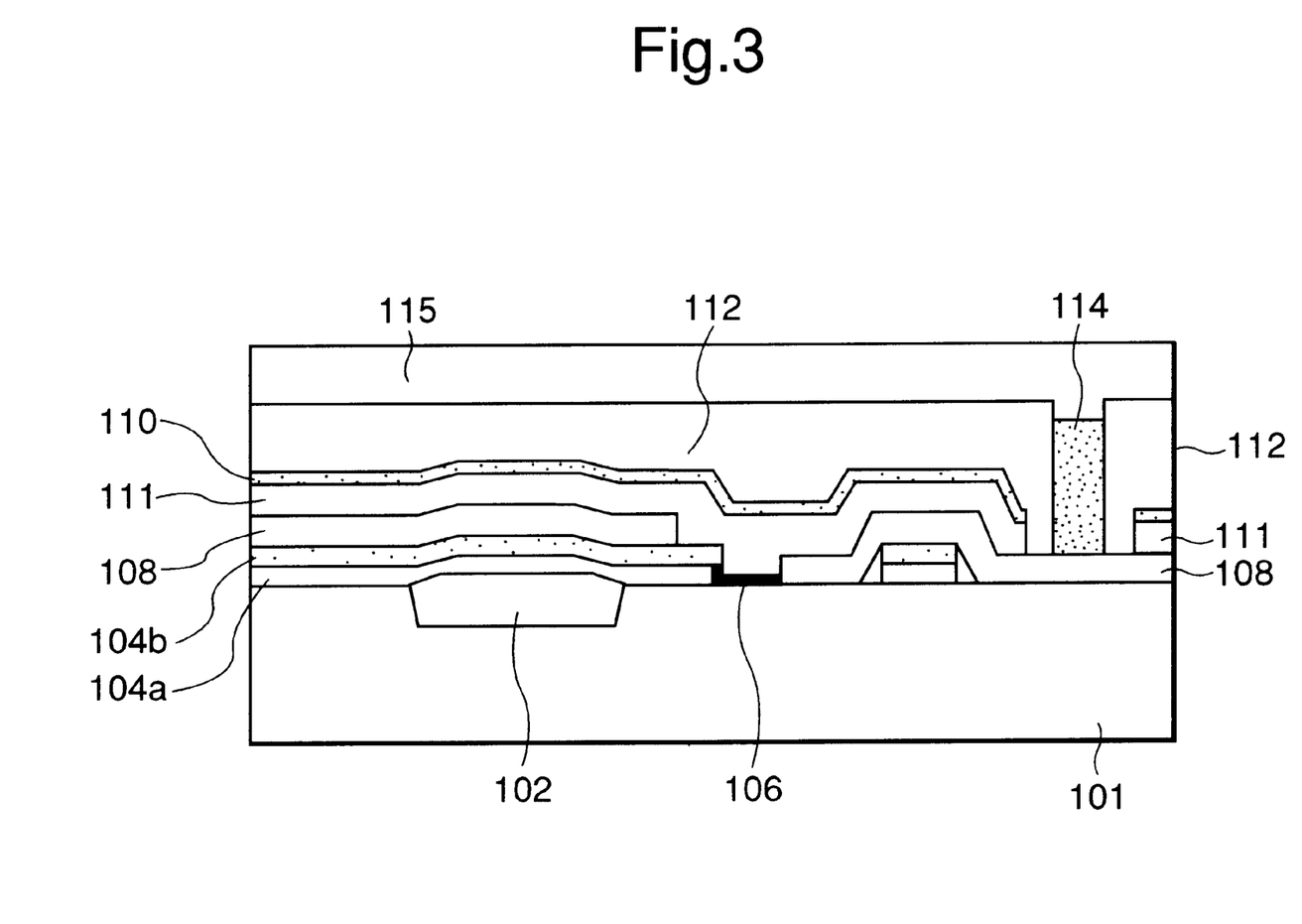
FIG. 3 a partial sectional view showing a construction of the semiconductor device according to the third embodiment of the present invention.

The semiconductor device of the third embodiment comprises, as shown in FIG. 3, a direct contact 106 for the gate electrode and the diffusion layer, where Ti Six 121 remains.

FIGS. 11(a)–(f) are a series of partial sectional views showing the production method of the semiconductor device of the third embodiment in the order of the process.

Figure 11A:
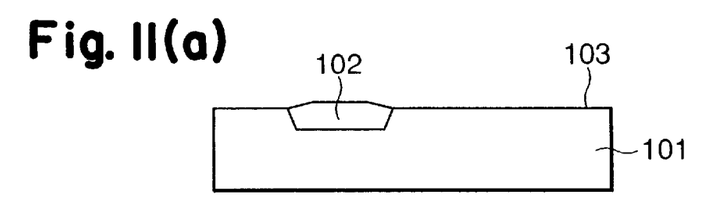
FIGS. 11(a)–11(f) show a partial sectional construction for explaining an example of the production process of the semiconductor device according to the third embodiment of the present invention.
Figure 11B:
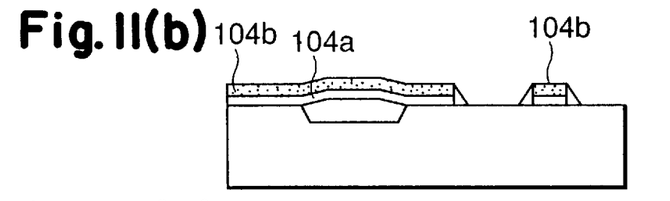
Figure 11C:
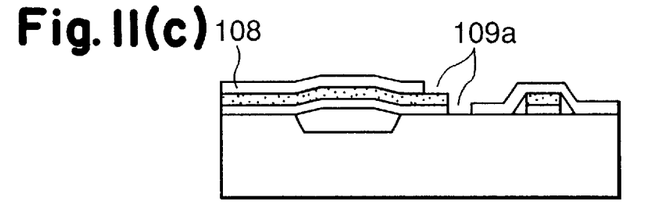

(a) to (c) in this method is the same as (a) to (c) in the second embodiment, showing the process until the opening of the poly poly contact is formed.

Figure 11D:
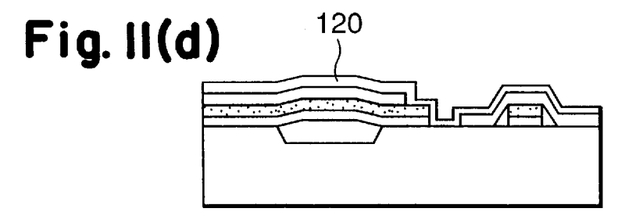

(d) Next, As (arsenic) is implanted on the entire surface under 50 keV, about 1 exp 15 atoms/$cm^2$, thereafter, a film of a metal titanium 120 is formed in about 300 angstrom. And then, performing a thermal treatment under 690° C. for about 30 seconds will form a titanium silicide (TiSi2) 121 inside the poly poly contact, only on a silicon exposed part.

Figure 11E:
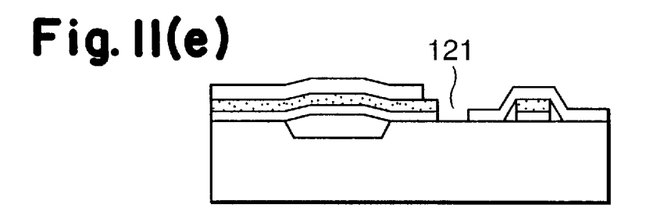

(e) In this state, soaking into a mixed liquid of ammonia and hydrogen peroxide will lay down only TiSi2 121 as it is inside the poly poly contact, and a titanium film overlying the silicon oxide film is removed. This TiSi2 121 functions as the direct contact for the gate electrode and the diffusion layer. This is the principle same as the so-called salicide process.

Figure 11F:
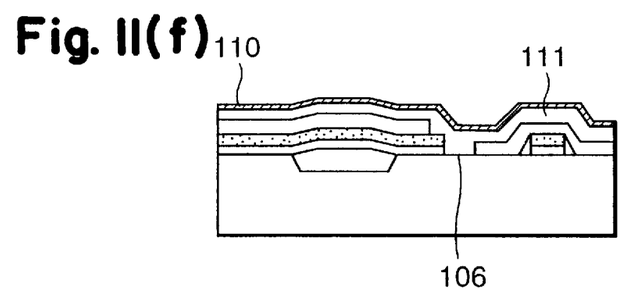

(f) Thereafter, a thermal treatment under 870° C. for about 10 seconds is applied to lower the resistance of the TiSi2 121, and afterward, a second poly Si 110 and WSi 111 are formed in the same manner as in the second embodiment.

The subsequent processes thereafter are the same as in the first and the second embodiment, after all these processes, the semiconductor device of the third embodiment is completed as shown in FIG. 3.

In the process of forming the direct contact of the third embodiment, the high melting point metal sputtering and the etch back may be applied instead of TiSi2. In this case, only the flat part of the high melting point metal is required to be removed.

In the process of forming the direct contact of the first embodiment, the selective W growth may fill up the inside of the through-hole. Since W does not grow on a place except the through-hole, the direct contact can be formed with the minimum processes.

In the second and the third embodiment, the direct contact 106 inside the poly poly contact may be completely filled up with a conductive material such as the high melting point metal so that whole the inside of the through-hole is crammed with the conductive material. Particularly when the poly poly contact is small, whole the inside of the through-hole is inevitably filled up with the conductive material, and this aspect is effective.

The connection of the direct contact may be done with only one side of the gate electrode, instead of both sides.

In the semiconductor device of the invention, as described above, the second conductive layer takes or a structure in which a high melting point metal film and a high resistance poly Si film are laminated; therefore, the second conductive film is not necessary to form thick, and the resistance of the connected area in the first and the second conductive film can easily be controlled.

Since the first conductive layer is a low resistance conductor of which surface is oxidized inside the through-hole, high melting point metal, or metal silicide of the foregoing metal, the resistance variation due to the diffusion of the impurities from the upper layer becomes a negligible degree. Therefore, the production margin for the thermal hysteresis in the subsequent process increases, and thinning the 2 poly film becomes effective. Since, the resistance of this metal is lower than that of the poly Si resistor, is effective to reduce the resistance of the power supply line.

Since the construction is made such that the opening diameter of the through-hole on the second conductive layer is larger than the width of the short arm of the first conductive layer, the side wall of the gate electrode being the first conductive layer inside the through-hole comprises the third conductive layer of low resistance, and the upper area of the third conductive layer comprises a high resistance silicon film, the PR process for the direct contact can be removed without increasing the number of the Al wiring layers, and memory cells can be integrated with high density.

According to the production method of the semiconductor relating to the invention, the second conductive layer is formed such that the poly Si film is formed on the whole surface of the insulating layer overlying the first conductive film so as not to fill up the through-hole, on the surface of the poly Si film, the high melting point metal film is formed into a laminated structure. Therefore, the low resistance layer is formed of the high melting point metal, a lower resistance than that of the poly Si resistor can be achieved, the diffusion of impurities from the low resistance wirings can be ignored, and the production margin for the thermal hysterisis can be enhanced. And, since the poly Si film is formed so as not to fill up the through-hole, this method can stably be applied when a large diameter through-hole is formed, the etch back process for the poly Si of the second conductive film can be eliminated, so that the production quality can be stabilized in addition to the process reduction.

After the poly Si film is formed, impurity ions are implanted on the surface of the poly Si film, and thereby the resistance of the power supply line on the second conductive film can be lowered.

Before the poly Si film formed, to oxidize the surface of the first conductive film on the inner surface of the through-hole can stably form a high resistance layer.

After the poly Si film is formed and before the metal film of low resistance and high melting point is formed, the hydrogen annealing is applied to the poly Si film; thereby load resistance can be increased still higher.

According to the second production method, the whole inside of the through-hole of the poly poly contact can be prevented from increasing the resistance, and the aluminum wiring of more than three layers is not needed.

What is claimed is:

1. A semiconductor device having a first conductive film formed on a silicon substrate, an insulating layer formed on the first conductive film, and a second conductive film electrically connected to said first conductive film through a through-hole piercing said insulating layer from the upper part of said insulating layer, wherein an opening diameter of the through-hole on said second conductive film is larger than a width in the short arm direction of the first conductive film, a side wall of a gate electrode being at least the first conductive film inside the through-hole includes a third conductive film of a low resistance, and a silicon film of a high resistance overlies said third conductive film.

2. A semiconductor device, comprising:

first and second power supply lines;

first and second bit lines;

a first transistor connected between said first bit line and a first direct contact node;

a second transistor connected between said first direct contact node and said first power supply line, and having a gate connected to a second direct contact node;

a first resistive element connected between said first direct contact node and said second power supply line;

a third transistor connected between said second bit line and said second direct contact node; and a fourth transistor connected between said second direct contact node and said first power supply line, and having a gate connected to said first direct contact node, wherein said first and second resistive elements are formed by a first conductivity layer and a second conductivity layer.

3. The semiconductor device as claimed in claim 2, wherein said first conductivity layer is a polysilicon layer having a high resistance value, and said second conductivity layer is a high melting point metal having a low resistance value.

* * * * *